United States Patent
Lester et al.

(10) Patent No.: US 7,942,459 B2
(45) Date of Patent: May 17, 2011

(54) MOUNTING DEVICE FOR A LINE REPLACEABLE UNIT IN AN AIRCRAFT AND A METHOD FOR USING THE SAME

(75) Inventors: Gerald E. Lester, Costa Mesa, CA (US); Terry Lo, Hsinchu (TW); Tomson Tseng, Hsinchu (TW); Ton Do, Corona, CA (US); Randall Welch, Mission Viejo, CA (US)

(73) Assignee: Thales Avionics, Inc., Irvine, CA (US)

( * ) Notice: Subject to any disclaimer, the term of this patent is extended or adjusted under 35 U.S.C. 154(b) by 671 days.

(21) Appl. No.: 11/978,815

(22) Filed: Oct. 30, 2007

(65) Prior Publication Data

US 2008/0237440 A1    Oct. 2, 2008

Related U.S. Application Data

(60) Provisional application No. 60/855,351, filed on Oct. 30, 2006.

(51) Int. Cl.
*B65D 45/32* (2006.01)
*B65D 45/00* (2006.01)

(52) U.S. Cl. .................. 292/256.71; 292/256

(58) Field of Classification Search ........ 292/212, 292/240, 256.71, 304, 256
See application file for complete search history.

(56) References Cited

U.S. PATENT DOCUMENTS

| | | | |
|---|---|---|---|
| 362,152 A * | 5/1887 | Ferren | 292/210 |
| 1,357,864 A * | 11/1920 | Harrington | 292/212 |
| 1,876,115 A * | 9/1932 | Way | 70/139 |
| 2,269,264 A * | 1/1942 | Haim | 292/62 |
| 2,525,217 A * | 10/1950 | Glitsch | 292/256.73 |
| 2,634,146 A * | 4/1953 | Johnson | 292/194 |
| 2,762,473 A * | 9/1956 | Swerdlow | 49/395 |
| 2,772,906 A * | 12/1956 | Esmond | 292/212 |
| 3,123,418 A * | 3/1964 | Haerther et al. | 292/256.71 |
| 4,926,287 A | 5/1990 | Rossman et al. | |
| 5,046,340 A | 9/1991 | Weinerman et al. | |
| 5,172,944 A * | 12/1992 | Munich et al. | 292/39 |
| 5,630,632 A * | 5/1997 | Swan | 292/240 |
| 5,887,916 A * | 3/1999 | Finkelstein et al. | 292/241 |

(Continued)

FOREIGN PATENT DOCUMENTS

| | | |
|---|---|---|
| EP | 0 579 578 A1 | 1/1994 |
| GB | 2 210 839 A | 6/1989 |

*Primary Examiner* — Carlos Lugo
(74) *Attorney, Agent, or Firm* — Drinker Biddle & Reath LLP

(57) ABSTRACT

A mounting device for a line replaceable unit in an aircraft, and a method for using the same. The mounting device provides for easy installation and removal of a line replaceable unit from overhead mounting apparatus or mounting rails in an aircraft, in particular, an Airbus. The mounting device includes a fixing block having a least one opening, and at least one assembly including a shaft portion passing through the opening, a clamping element and a visual position element whose orientation indicates an orientation of the clamping element. The assembly is operable such that the clamping element secures the device to a component of the vehicle when positioned in a first position, and releases the device when positioned in a second position, and the visual position element provides an indication of whether the clamping element is in the first or second position.

20 Claims, 4 Drawing Sheets

U.S. PATENT DOCUMENTS

| | | |
|---|---|---|
| 6,123,373 A | 9/2000 | Yoshida |
| 6,357,804 B1 * | 3/2002 | Bernier et al. ................. 292/114 |
| 6,676,176 B1 * | 1/2004 | Quandt ......................... 292/202 |
| 7,100,951 B2 * | 9/2006 | Jien ............................... 292/207 |
| 7,296,831 B2 * | 11/2007 | Generowicz et al. ......... 292/242 |
| 7,699,365 B2 * | 4/2010 | Liang et al. ................... 292/240 |

* cited by examiner

US 7,942,459 B2

MOUNTING DEVICE FOR A LINE REPLACEABLE UNIT IN AN AIRCRAFT AND A METHOD FOR USING THE SAME

CROSS-REFERENCE TO RELATED PATENT APPLICATION

This application claims benefit from U.S. Provisional Application No. 60/855,351, filed on Oct. 30, 2006, the entire content being incorporated herein by reference.

BACKGROUND OF THE INVENTION

1. Field of the Invention

The present invention relates to a mounting device for a line replaceable unit in an aircraft, and a method for using the same. More particularly, the present invention relates to a mounting device that provides for easy installation and removal of a line replaceable unit from a mounting apparatus in an aircraft.

2. Description of the Related Art

Certain aircraft, such as an Airbus, have mounting rails or other apparatus for mounting line replaceable units (LRUs) in the aircraft. Certain devices for attaching an LRU to the mounting rails or mounting apparatus can bind and not allow for easy removal of the LRU from the rails or mounting apparatus.

BRIEF DESCRIPTION OF THE DRAWINGS

Objects, advantages and novel features of the invention will be more readily appreciated from the following detailed description when read in conjunction with the accompanying drawings, in which.

DETAILED DESCRIPTION OF THE PREFERRED EMBODIMENTS

Figure 1:
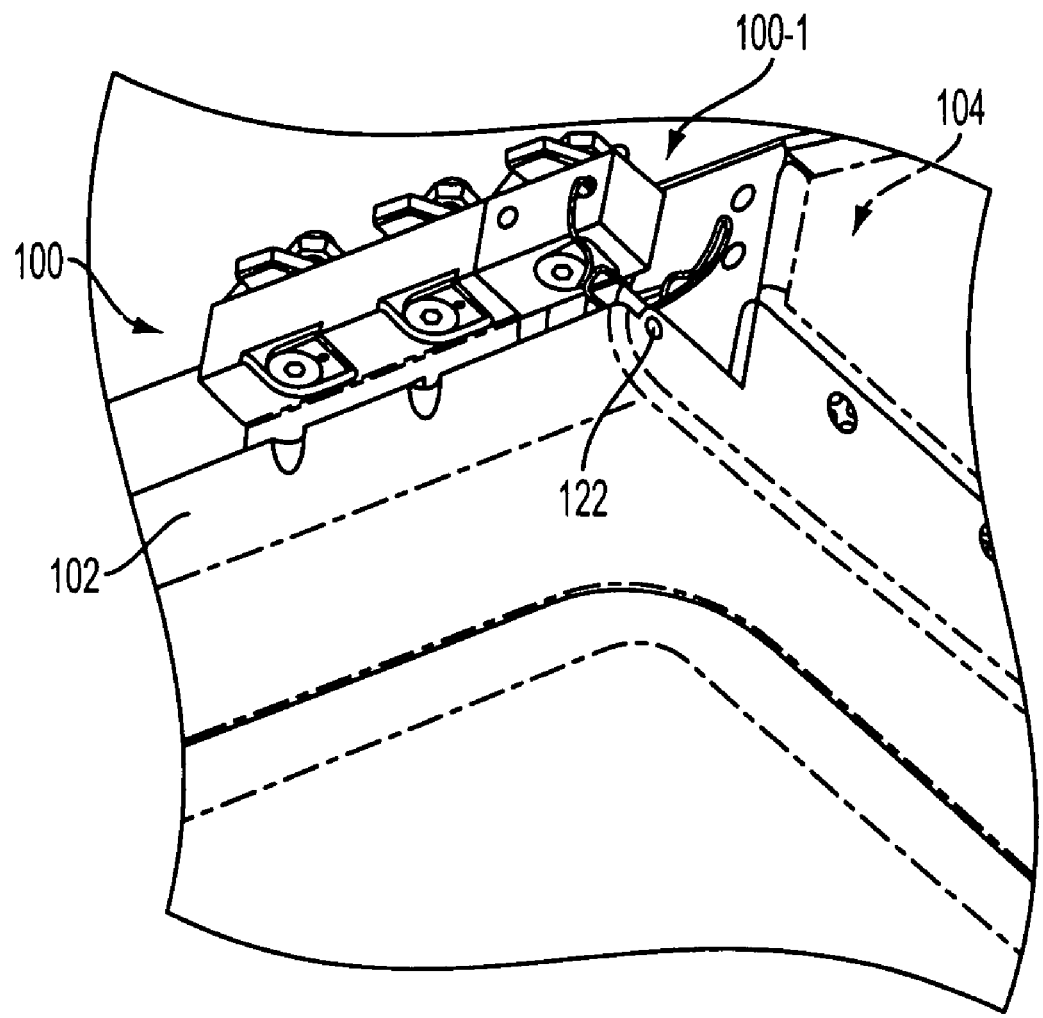
FIG. 1 is a perspective view illustrating mounting devices for mounting a line replaceable unit to mounting apparatus in an aircraft according to an embodiment of the present invention.

As described in detail below, the present invention relates to a mounting device that provides for easy installation and removal of a line replaceable unit from overhead mounting apparatus in an aircraft. FIG. 1 illustrates a mounting device 100 for mounting a line replaceable unit (LRU) 104 to a panel 102 according to an embodiment of the present invention. The mounting device 100 can, for example, be about 3 inches in length by about 1 inch in height by about 0.75 inches in depth, and can be made of stainless steel, metal or any other suitable material.

Figure 2:
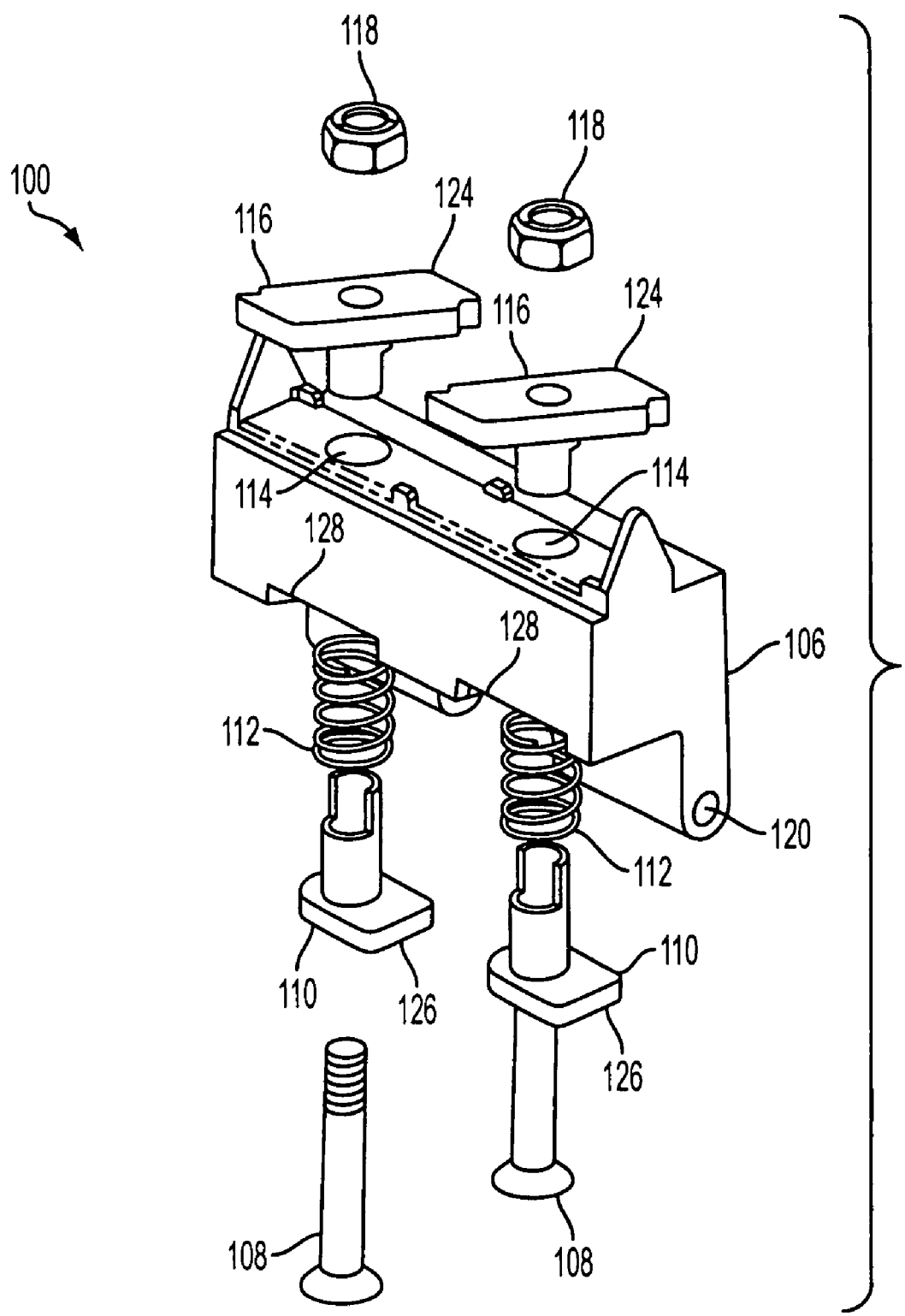
FIG. 2 is an exploded perspective view illustrating further details of a mounting device as shown in FIG. 1.

As shown in more detail in FIG. 2, the mounting device 100 include a fixing block 106. Screws 108 pass through openings in respective visual position elements 110, and further through respective springs 112. The screws 108 further pass through respective openings 114 in the fixing block 106, and through respective clamping elements 116. Respective locking nuts 118 attach to the ends of the respective screws 108 to secure the screws 108, visual position elements 110, springs 112 and clamping elements 116 to the fixing block 106.

The fixing block 106 further includes an opening 120 that receives a pin 122 attached to panel 102 (see FIG. 1) to thus secure the fixing block 106 to the panel 102. It can be appreciated from FIGS. 1 and 2 that the clamping elements 116 each have a flange 124 that extends perpendicular to or substantially perpendicular to the respective flanges 126 of visual position elements 110.

Figure 3:
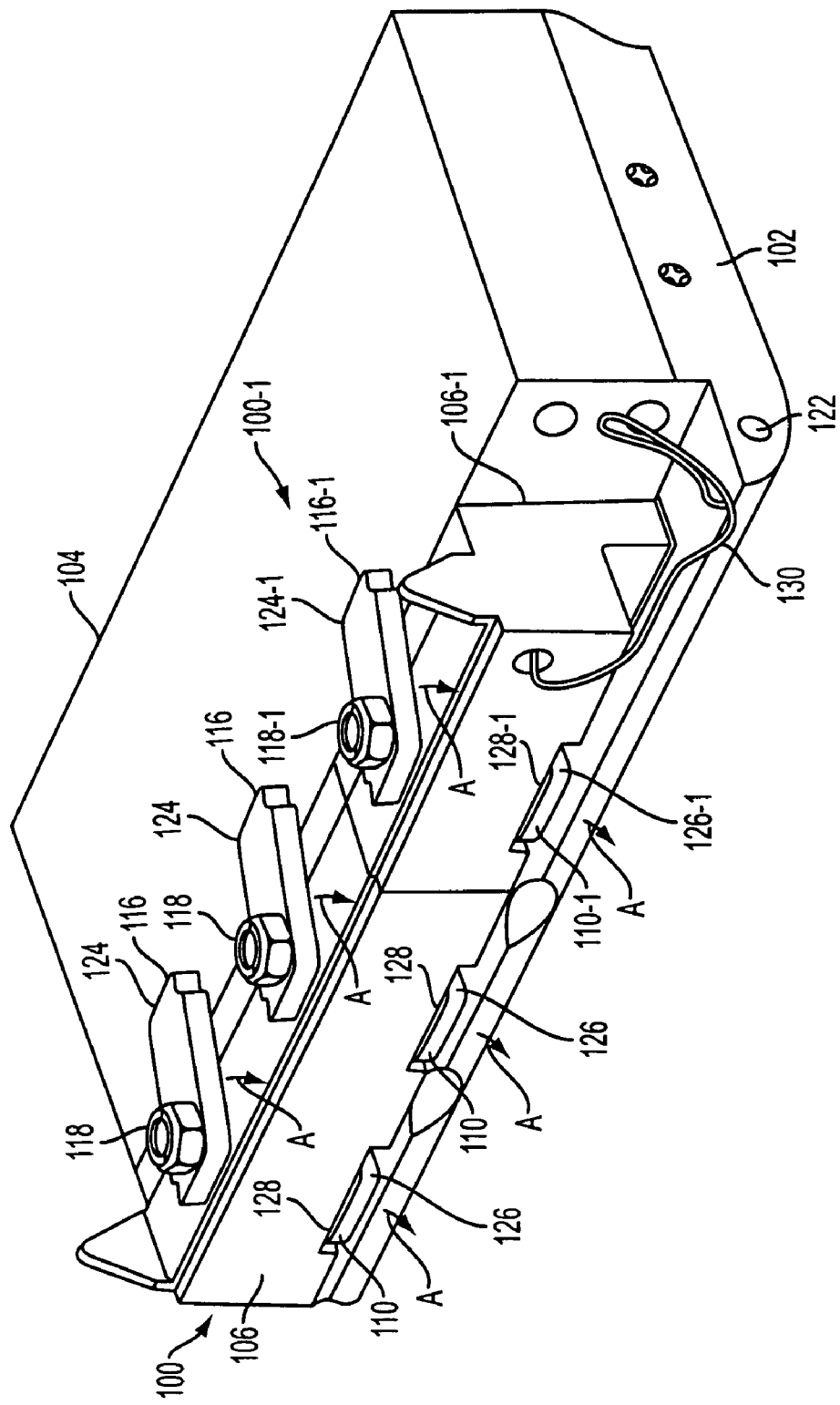
FIG. 3 is a top perspective view showing the mounting devices of FIGS. 1 and 2 where the clamping elements of the mounting devices are positioned to secure the line replaceable unit to the mounting apparatus according to an embodiment of the present invention.
Figure 4:
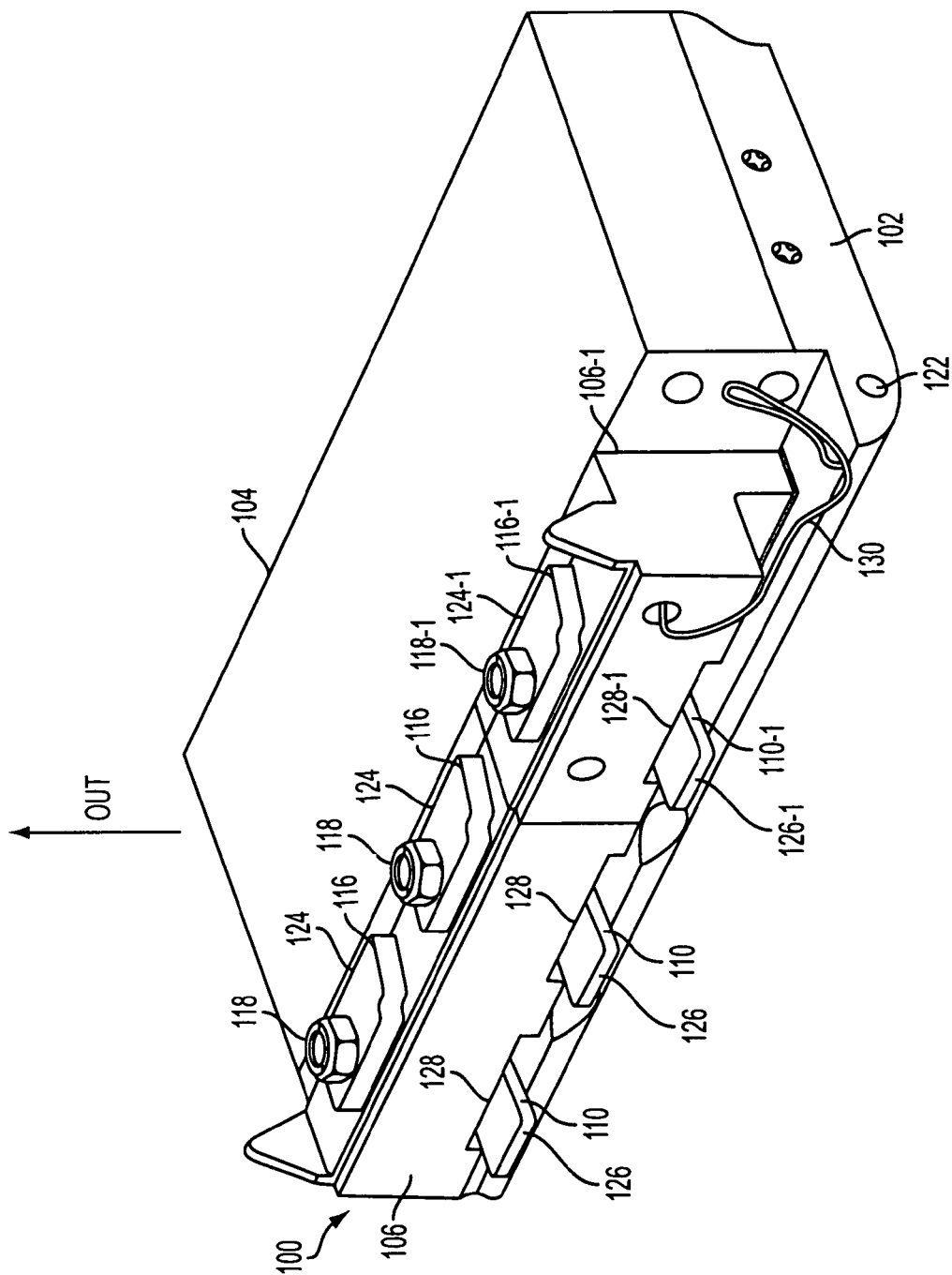
FIG. 4 is a top perspective view showing the mounting devices of FIGS. 1 and 2 where the clamping elements of the mounting devices are positioned to release the line replaceable unit from the mounting apparatus according to an embodiment of the present invention.

In addition, although the fixing block 106 in this example is shown as having two openings 114, the fixing block 106 can have any suitable length, size and shape, and can include any suitable number of openings 114 and corresponding components as discussed above. For example, as shown in FIGS. 1, 3 and 4, the mounting device can be configured as mounting device 100-1 having a fixing block 106-1 having a single opening (not shown) to accommodate one clamping element 116-1 and corresponding visual position element 110-1, and their associated components similar to those discussed above with regard to clamping element 116 and visual position element 110. Also, a fixing block (e.g., fixing block 106-1) can be configured to allow a wire or power cord 130 to pass therethrough, or to accommodate other components that can be used with the line replaceable unit 104.

When the visual position elements 110 and 110-1 are oriented as shown in FIGS. 1-3, the clamping elements 116 and 116-1 are oriented as also shown in FIGS. 1-3. The flanges 124 and 124-1 thus extend over the surface of the line replaceable unit 104 and secure the line replaceable unit 104 to the panel 102. To remove the line replaceable unit 104, one can use, for example, a screwdriver or Allen wrench to rotate each of the visual position elements 110 and 110-1 by 90 degrees or about 90 degrees in the direction of arrow A, so that their flanges 126 and 126-1 extend outwardly from slots 128 and 128-1 in fixing blocks 106 and 106-1 as shown in FIG. 4. In this event, clamping elements 116 and 116-1 also are rotated by 90 degrees or about 90 degrees such that their flanges release the outer surface of the line replaceable unit 104 and extend parallel or substantially parallel with the length of fixing blocks 106 and 106-1. Hence, line replaceable unit 104 can be easily removed from the panel 102.

Although only a few exemplary embodiments of the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An apparatus for mounting a device into a vehicle, the apparatus comprising:

a fixing block that is attachable to at least one surface of the device and having a portion that is contactable with a mounting surface of a vehicle component, the fixing block having a least one opening therein;

at least one assembly comprising:
a shaft portion,
a clamping element comprising an opening; and
a visual position element comprising an opening, wherein the visual position element orientation indicates an orientation of the clamping element,
the shaft portion passing through the opening in the fixing block, the clamping element, and the visual position element, wherein the clamping element and the visual position element are axially displaced along the shaft portion, and the assembly being operable such that:
the clamping element secures the device to a component of the vehicle when positioned in a first position, and
releases the device when positioned in a second position, and
the visual position element provides an indication of whether the clamping element is in the first or second position via a linkage mechanism between the clamping element and the visual position element that forces the clamping element or the visual position element to fixedly move with and when the visual position element or the clamping element, respectively, is moved;

wherein:
the fixing block further includes at least one recess substantially aligned with said at least one opening that is recessed in at least a first planar and a second planar surface of the fixing block, the visual position element being situated within the recess,
the visual position element having a first planar surface that is essentially co-planar with a first planar surface of the fixing block at all times, and a second planar surface that is essentially co-planar with the second planar surface of the fixing block only when the clamping element is in the first position or the second position.

2. An apparatus as claimed in claim 1, wherein:
the fixing block further includes another opening for receiving a mounting component that mounts the fixing block to the component of the vehicle.

3. An apparatus as claimed in claim 1, wherein:
the assembly rotates about an axis of the shaft portion to move the clamping element between the first and second positions via the linkage mechanism.

4. An apparatus as claimed in claim 3, wherein:
the visual position element and the clamping element rotate in unison about the axis of the shaft portion when the clamping element is moved between the first and second positions.

5. An apparatus as claimed in claim 1, wherein:
the fixing block includes a plurality of said openings; and
the apparatus includes a plurality of said assemblies, each comprising a respective shaft portion, a respective clamping element and a respective visual position element, with the respective shaft portion passing through a respective one of the openings.

6. An apparatus as claimed in claim 1, wherein:
the assembly includes a spring, positioned about the shaft portion between the clamping element and visual position element to provide an urging force with urges the clamping element and visual position element away from each other.

7. An apparatus as claimed in claim 1, wherein:
the visual position element has a length that extends in a direction substantially normal to a direction in which a length of the clamping element extends when the visual position element and clamping element are coupled to the shaft portion.

8. An apparatus as claimed in claim 1, wherein:
the shaft portion includes an end having a recess therein, for receiving a device which is operable to rotate the shaft portion between the first and second positions by contacting at least one of the visual position element or the clamping element when the device applies torque to the shaft portion.

9. An apparatus as claimed in claim 1, wherein:
the device comprises a line replaceable unit (LRU); and
the vehicle is an aircraft.

10. An apparatus as claimed in claim 1, wherein:
the clamping element has a first surface that contacts an upper surface of the device, which is separate from the assembly, when the clamping element is positioned in the first position and the device is on the component and a lower surface of the device, opposite to the upper surface, contacts the component, such that the device is positioned between the clamping element and the component.

11. A method for mounting a device into a vehicle, the method comprising:
providing a fixing block that is attachable to at least one surface of the device and having a portion that is contactable with a mounting surface of a vehicle component, the fixing block having a least one opening therein, and at least one assembly comprising a shaft portion, a clamping element comprising an opening, and a visual position element comprising an opening, wherein orientation indicates an orientation of the clamping element, with the shaft portion passing through the opening in the fixing block, the clamping element, and the visual position element, wherein the clamping element and the visual position element are axially displaced along the shaft portion; and
operating the assembly such that the clamping element secures the device to a component of the vehicle when positioned in a first position, and releases the device when positioned in a second position, and the visual position element provides an indication of whether the clamping element is in the first or second position via a linkage mechanism between the clamping element and the visual position element that forces the clamping element or the visual position element to fixedly move with and when the visual position element or the clamping element, respectively, is moved;

wherein:
the fixing block further includes at least one recess substantially aligned with said at least one opening that is recessed in at least a first planar and a second planar surface of the fixing block, the visual position element being situated within the recess,
the visual position element having a first surface that is essentially co-planar with a first planar surface of the fixing block at all times, and a second surface that is essentially co-planar with the second planar surface of the fixing block only when the clamping element is in the first position or the second position.

12. A method as claimed in claim 11, wherein:
the fixing block further includes another opening; and
the method further comprising inserting a mounting component into said another opening to mount the fixing block to the component of the vehicle.

13. A method as claimed in claim 11, wherein:
the operating comprises rotating the assembly about an axis of the shaft portion to move the clamping element between the first and second positions via the linkage mechanism.

14. A method as claimed in claim 13, wherein:
the visual position element and the clamping element rotate in unison about the axis of the shaft portion when the clamping element is moved between the first and second positions.

15. A method as claimed in claim 11, wherein:
the fixing block includes a plurality of said openings;
the apparatus includes a plurality of said assemblies, each comprising a respective shaft portion, a respective clamping element and a respective visual position element, with the respective shaft portion passing through a respective one of the openings; and
the operating comprises operating each of the assemblies such that its respective clamping element secures the device to a component of the vehicle when positioned in a first position, and releases the device when positioned in a second position, and its respective visual position element provides an indication of whether the respective clamping element is in the first or second position.

16. A method as claimed in claim 11, wherein:
the assembly includes a spring, positioned about the shaft portion between the clamping element and visual position element to provide an urging force with urges the clamping element and visual position element away from each other.

17. A method as claimed in claim 11, wherein:
the visual position element has a length that extends in a direction substantially normal to a direction in which a length of the clamping element extends when the visual position element and clamping element are coupled to the shaft portion.

18. A method as claimed in claim 11, wherein:
the shaft portion includes an end having a recess therein; and
the operating comprises inserting a device into the recess and manipulating the device to rotate the shaft portion between the first and second positions by contacting at least one of the visual position element or the clamping element when the device applies torque to the shaft portion.

19. A method as claimed in claim 11, wherein:
the device comprises a line replaceable unit (LRU); and
the vehicle is an aircraft.

20. A method as claimed in claim 11, wherein:
the clamping element has a first surface; and
during the operating step, the first surface contacts an upper surface of the device, which is separate from the assembly, when the clamping element is positioned in the first position and the device is on the component and a lower surface of the device, opposite to the upper surface, contacts the component, such that the device is positioned between the clamping element and the component.

\* \* \* \* \*